US008344838B2

(12) United States Patent
Park et al.

(10) Patent No.: US 8,344,838 B2
(45) Date of Patent: Jan. 1, 2013

(54) TRANSFORMER AND TRANSFORMER ASSEMBLY

(75) Inventors: Geun Young Park, Gyunggi-do (KR); Sang Joon Seo, Gyunggi-do (KR); Jae Gen Eom, Gyunggi-do (KR); Chang Yong Kwon, Chungcheongnam-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 13/088,575

(22) Filed: Apr. 18, 2011

(65) Prior Publication Data

US 2011/0193668 A1 Aug. 11, 2011

Related U.S. Application Data

(63) Continuation-in-part of application No. 12/640,231, filed on Dec. 17, 2009, now Pat. No. 8,058,959.

(30) Foreign Application Priority Data

Oct. 9, 2009 (KR) ........................ 10-2009-0095908

(51) Int. Cl.
*H01F 27/06* (2006.01)
*H01F 27/28* (2006.01)
*H01F 27/29* (2006.01)
*H01F 27/30* (2006.01)
*H01F 5/00* (2006.01)

(52) U.S. Cl. .......... 336/65; 336/182; 336/192; 336/198; 336/200

(58) Field of Classification Search .................... 336/65, 336/182, 192, 198, 200
See application file for complete search history.

(56) References Cited

U.S. PATENT DOCUMENTS

| 4,661,792 | A  | * | 4/1987  | Watkins ........................... 336/65 |
| 5,515,021 | A  | * | 5/1996  | Rynkiewicz ..................... 336/65 |
| 6,587,026 | B2 | * | 7/2003  | Yeh et al. ....................... 336/223 |
| 6,727,793 | B2 | * | 4/2004  | Piechnick ....................... 336/198 |
| 6,876,555 | B2 | * | 4/2005  | Matsumoto et al. ........... 361/782 |
| 7,456,717 | B2 | * | 11/2008 | Grueso et al. .................. 336/192 |

(Continued)

FOREIGN PATENT DOCUMENTS

JP 6147612 3/1986

(Continued)

OTHER PUBLICATIONS

Chinese Office Action for Application No. CN200910263620.3 mailed Dec. 31, 2011.

(Continued)

*Primary Examiner* — Mohamad Musleh
*Assistant Examiner* — Ronald Hinson
(74) *Attorney, Agent, or Firm* — Lowe Hauptman Ham & Berner LLP

(57) ABSTRACT

A transformer includes: a bobbin on which a coil is wound; a core coupled with the bobbin to provide a magnetic flux, at least a portion of the core being installed on the PCB in a penetrating manner; and a base plate electrically connected to the coil and having a lead frame connected to the PCB, wherein the base plate is installed to be reversedly disposed at an upper side of the bobbin on the PCB, a space is formed between a lower surface of the base plate and an upper surface of the PCB, and the space between the lower surface of the base plate and the upper surface of the PCB is supported by a support member in contact with the upper surface of the PCB.

19 Claims, 9 Drawing Sheets

U.S. PATENT DOCUMENTS

2002/0070836 A1* 6/2002 Fujiyoshi et al. ............. 336/200
2007/0126542 A1* 6/2007 He et al. .......................... 336/83

FOREIGN PATENT DOCUMENTS

JP      2000-208336      7/2000
KR      1020050060114    6/2005

OTHER PUBLICATIONS

Office Action for U.S. Appl. No. 12/640,231 mailed Jun. 2, 2011.
Chinese Office Action for Application No. 200910263620.3 mailed Jun. 5, 2012.

* cited by examiner

TRANSFORMER AND TRANSFORMER ASSEMBLY

CROSS-REFERENCE TO RELATED APPLICATIONS

This application claims the priority of Korean Patent Application No. 10-2009-0095908 filed on Oct. 9, 2009 in the Korean Intellectual Property Office, the disclosure of which is incorporated herein by reference.

BACKGROUND OF THE INVENTION

1. Field of the Invention

The present invention relates to a transformer and, more particularly, to a transformer assembled in a reverse manner on a printed circuit board (PCB) to thereby reduce the height of the transformer mounted the PCB, and a transformer assembly.

2. Description of the Related Art

A transformer, a device for changing an AC voltage and a current value by using the phenomenon of electromagnetic induction, is one of the requisite components for electronic products. The transformer is fabricated by winding a coil on and around a large magnetic core. As for the coil, a primary coil is connected to an input circuit whose voltage is to be changed, and a secondary coil is connected to an output circuit in which the changed voltage is used.

Recently, research into a technique for reducing the overall size of electronic products is actively ongoing due to consumer demand, especially in the area of flat panel displays (FPDs), such as liquid crystal displays (LCDs), plasma display panels (PDPs), and organic light emitting diodes (OLEDs).

In general, in a transformer, a coil is wound on a bobbin coupled to a core, and the core is disposed on a base plate having a lead frame to which the coil is electrically connected.

The lead frame is formed by being bent in a direction perpendicular to that in which the core is mounted on the base plate, and mounted on the PCB.

When the transformer is installed at a normal position on the PCB, the height of a top face of the transformer is equal to the height of the transformer on the upper surface of the PCB.

This type of transformer cannot be further reduced in height, making it impossible to obtain a thinner flat panel display.

SUMMARY OF THE INVENTION

An aspect of the present invention provides a transformer assembled in a reverse form on a core through hole formed on a printed circuit board (PCB), thus being mounted on the PCB, and a transformer assembly.

According to an aspect of the present invention, there is provided a transformer including: a bobbin on which a coil is wound; a core coupled with the bobbin to provide a magnetic flux and installed on the PCB in a penetrating manner; and a base plate electrically connected to the coil and having a lead frame connected to the PCB, wherein the base plate is installed to be reversedly disposed at an upper side of the bobbin on the PCB, a space is formed between a lower surface of the base plate and an upper surface of the PCB, and the space between the lower surface of the base plate and the upper surface of the PCB is supported by a support member in contact with the upper surface of the PCB.

According to another aspect of the present invention, there is provided a transformer assembly including: a transformer comprised of a core coupled to a bobbin with a coil wound therearound and a base plate supporting the core; and a printed circuit board (PCB) having a through hole allowing at least a portion of the core to pass therethrough, a portion of the core being disposed in the through hole, wherein the transformer is installed on the PCB in a reversed form such that the base plate is disposed at an upper side of the bobbin on the PCB and a space is formed between a lower surface of the base plate and an upper surface of the PCB, the space being supported by a support member in contact with the upper surface of the PCB.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
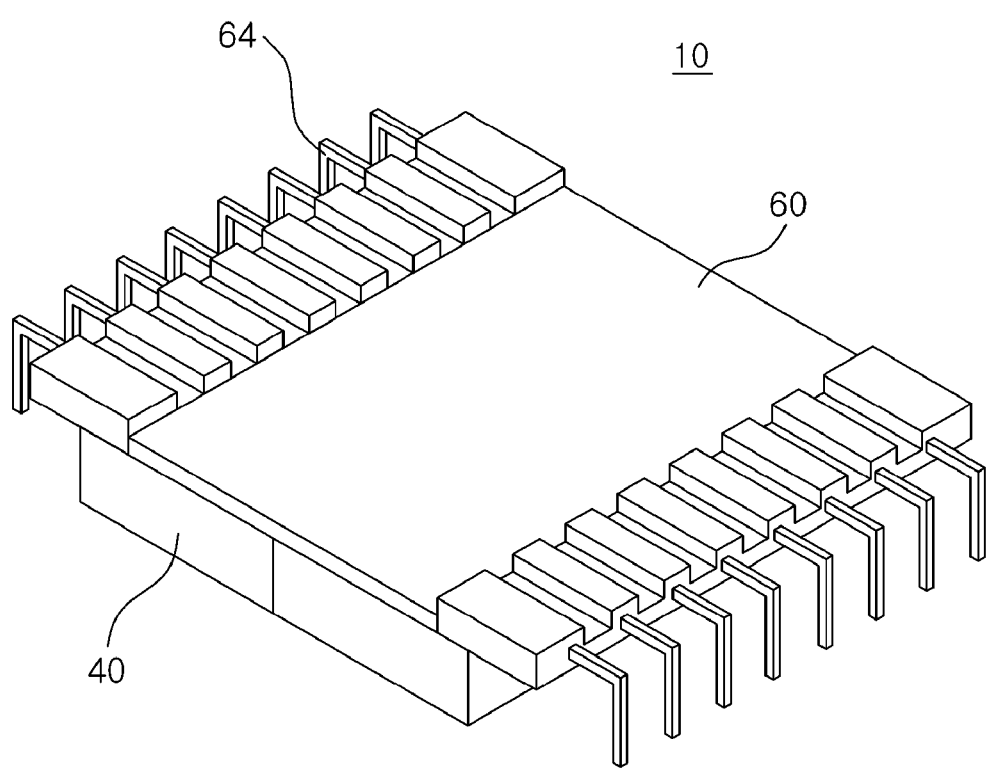
FIG. 1 is a schematic perspective view of a transformer according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, shapes and dimensions may be exaggerated for clarity, and the same reference numerals will be used throughout to designate the same or like components.

Figure 2:
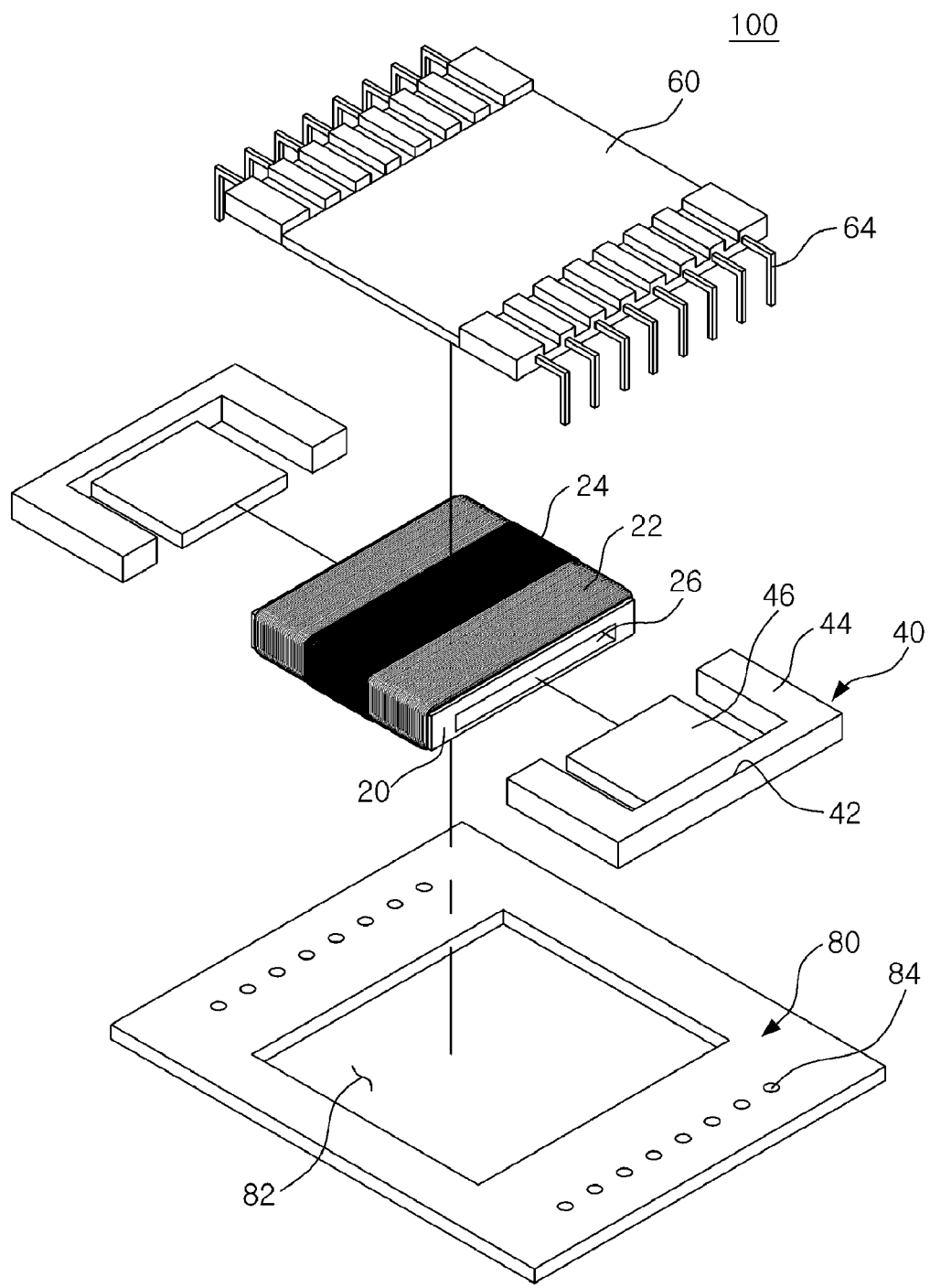
FIG. 2 is an exploded perspective view of a transformer assembly formed as the transformer is coupled to a printed circuit board (PCB) according to an exemplary embodiment of the present invention.

FIG. 1 is a schematic perspective view of a transformer according to an exemplary embodiment of the present invention, and FIG. 2 is an exploded perspective view of a transformer assembly formed as the transformer is coupled to a printed circuit board (PCB) according to an exemplary embodiment of the present invention.

Figure 3:
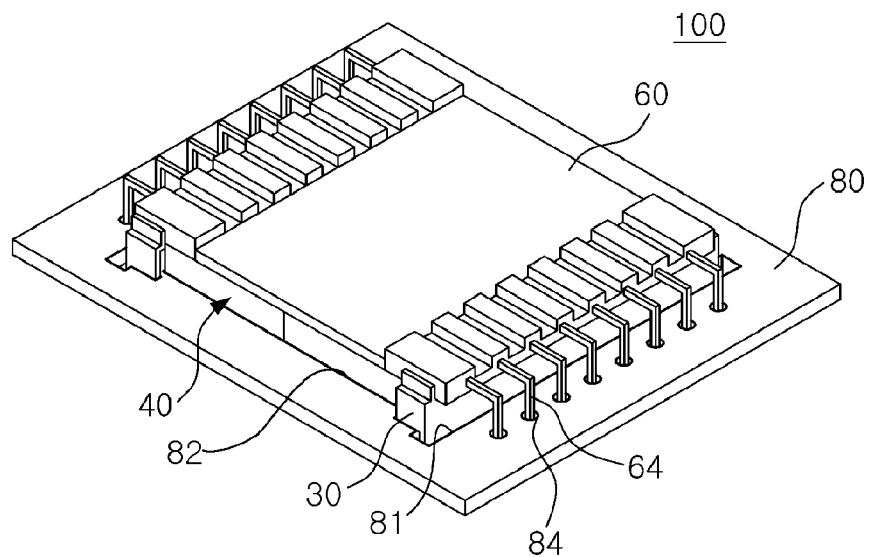
FIG. 3 is a schematic perspective view of a transformer assembly according to a first exemplary embodiment of the present invention.

With reference to FIGS. 1 to 3, a transformer assembly 100 according to an exemplary embodiment of the present invention includes a transformer 10, and a PCB 80 on which the transformer 10 is mounted.

The transformer 10 applied to the transformer assembly 100 can have all the technical features of the transformer 10 described hereafter.

The transformer 10 may include a bobbin 20, a core 40, and a base plate.

The core 40 may be coupled with the bobbin 20 on which coils 22 and 24 are wound. The bobbin 20 may have a rectangular section and include a middle foot portion insertion hole 26 in which a middle foot portion 44 can be inserted. A primary coil 22 may be wound on an outer circumferential surface of the bobbin 20, and a secondary coil 24 may be wound on an outer circumferential surface of the primary coil 22.

The core 40, a sintered body fabricated by sintering powder of a ferrite material, may have an 'E' shape. Namely, the core 40 may have outer foot portions 44 at edges of a core base 44, and a middle foot portion 46 may be formed between the outer foot portions 44.

Here, in the present exemplary embodiment, the core 40 has the 'E' shape; however, it is not limited thereto, and the core 40 may have any other shape as deemed necessary.

The core 40 is coupled with the bobbin 20 to provide magnetic flux, and the combination thereof may be installed on a printed circuit board (PCB) 80 in a penetrating manner.

Meanwhile, the wound shape and arrangement of the primary and secondary coils 22 and 24 may be easily changed according to the preference of a skilled person in the art.

The base plate 60 may include a lead frame 64 electrically connected with the coil 40 so as to be connected with the PCB 80.

The core 40 and the coils 22 and 24 may be fixed on the base plate 60 by an adhesive or varnish impregnation (or varnish dropping and infiltrating.

Meanwhile, the transformer 10 may be mounted in a reversed manner on the PCB 80.

Here, the lead frame 64 may be formed such that the base plate 60 is separated from an upper surface of the PCB 80. Namely, a through hole 82 allowing the core 40 to pass therethrough is formed on the PCB 80, and a portion of the core 40 may be disposed within the through hole 82.

Accordingly, a lower surface of the base plate 60 may be separated from the upper surface of the PCB 80 by a space equal to the distance by which the core 40 is exposed (i.e., protruded) from the upper surface of the PCB 80.

In order to fix the transformer 10 in a reversed manner on the PCB 80, the base plate 60 may have the lead frame 64 allowing the base plate 60 and the PCB 80 to have a space therebetween.

The lead frame 64 may be bent to extend in the direction in which the core 40 is mounted, and may be inserted into lead frame insertion holes 84 formed on the PCB 80 so as to be mounted.

When the transformer 10 is configured in the reversed form to allow a portion of the core 40 to be inserted into the through hole 82 of the PCB 80, the base plate 60 can be separated by a certain amount of space without being in contact with the PCB 80.

Also, because the core 40 is disposed below the through hole 82, the height of the transformer 10 from the PCB 80 can be remarkably reduced. As a result, compared with a flat panel display in which the transformer is installed in a normal position (i.e., normal state, or normal shape) on the PCB 80, the thickness of the flat panel display with the transformer 10 in the reversed form can be reduced.

Exemplary embodiments for firmly coupling the transformer 10 on the PCB 80 will now be described.

Figure 4:
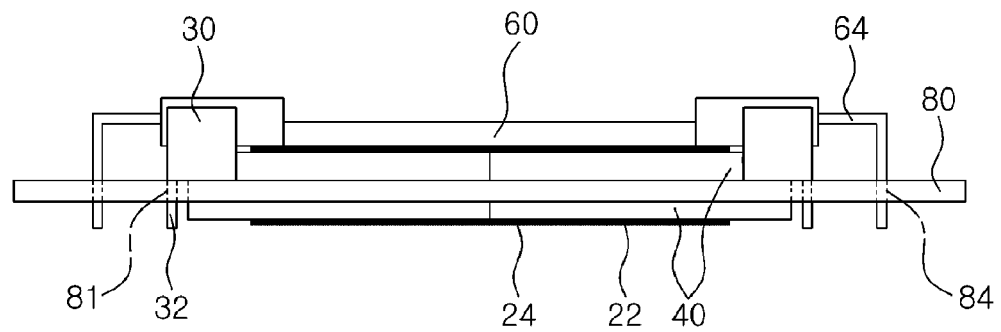
FIG. 4 is a side view of the transformer assembly according to the first exemplary embodiment of the present invention.

FIG. 3 is a schematic perspective view of a transformer assembly according to a first exemplary embodiment of the present invention, and FIG. 4 is a side view of the transformer assembly according to the first exemplary embodiment of the present invention.

With reference to FIGS. 3 and 4, in a transformer assembly 100 according to a first exemplary embodiment of the present invention, an insulating member 30 may be provided in the space between the PCB 80 and the base plate 60.

The insulating member 30, an injection-molded product, a member separate from the base plate 60 may be fastened to an insulating member insertion hole 81 formed on the PCB 80.

The insulating member 30 may support the base plate 60 and may be installed to be adjacent to the lead frame 64.

Because the insulating member 30 is provided in the space between the PCB 80 and the base plate 60, the transformer 10 can be not only insulated but also stably supported on the PCB 80.

Figure 5:
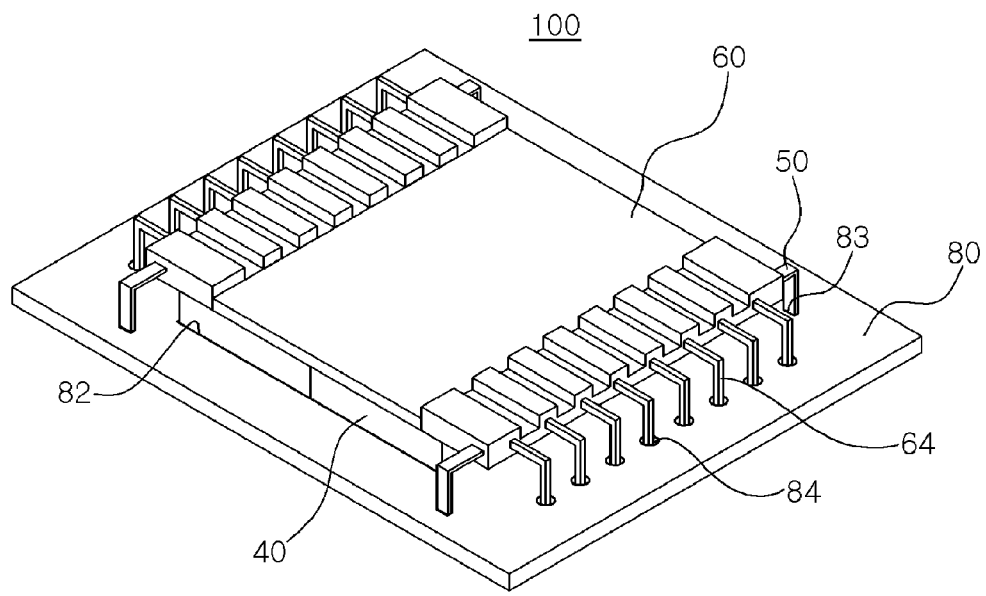
FIG. 5 is a schematic perspective view of a transformer assembly according to a second exemplary embodiment of the present invention.
Figure 6:
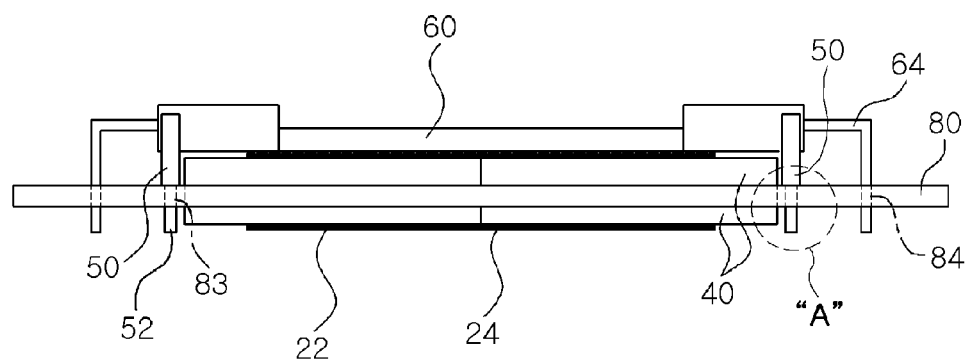
FIG. 6 is a side view of the transformer assembly according to the second exemplary embodiment of the present invention.
Figure 11:
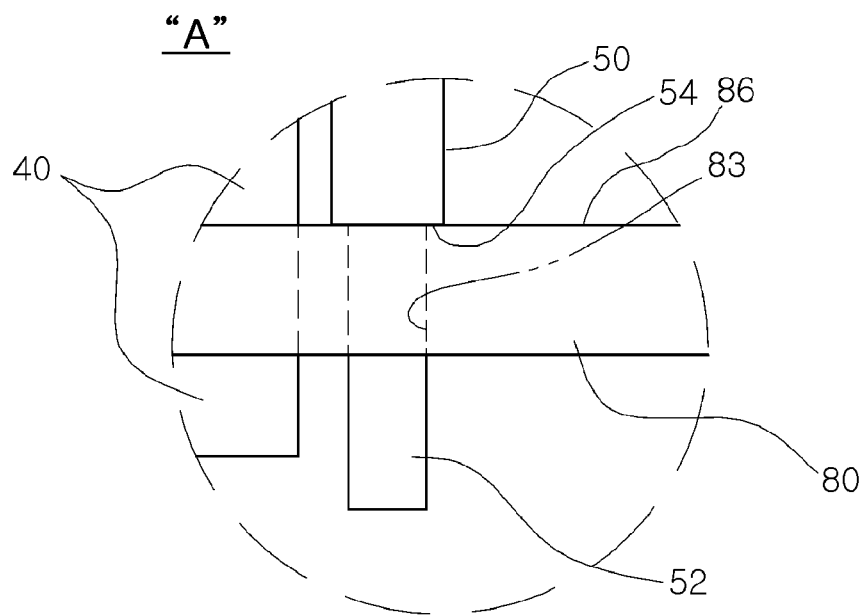
FIG. 11 is an enlarged sectional view of portion 'A' of FIG. 6.

FIG. 5 is a schematic perspective view of a transformer assembly according to a second exemplary embodiment of the present invention, and FIG. 6 is a sectional view of the transformer assembly according to the second exemplary embodiment of the present invention. FIG. 11 is a partially enlarged view of a portion 'A' in FIG. 6.

With reference to FIGS. 5, 6, and 11, in the transformer assembly 100 according to the second exemplary embodiment of the present invention, the base plate 60 may include a support pin 50 as a support member, supporting the space between the base plate 60 and the PCB 80.

The support pin 50 may be fastened to a support pin hole 83 formed on the PCB 80 to complement a fixing force for fixing the lead frame 64 of the transformer 10 on the PCB 80.

The support pin 50 may include a support pin extending portion 52 which extends from a lower end of the support pin 50 and has a narrower sectional area than that of the support pin 50. The support pin extending portion 52 is insertedly fastened to the support pin hole 83 formed on the PCB 80 to allow the coil part to be stably fixed to the PCB 80.

Here, the support pin hole 83 may be formed to correspond to the size of the support pin extending portion 52. Accordingly, since the lower portion of the support pin 50 is in contact with the PCB 80, the weight of the base plate 60 on which the lead frame 64 is formed can be stably supported.

The support pin extending portion 52 does not only stably support the weight of the base plate 60 but also complements the fixing force of the lead frame 64 and the PCB 80.

Figure 7:
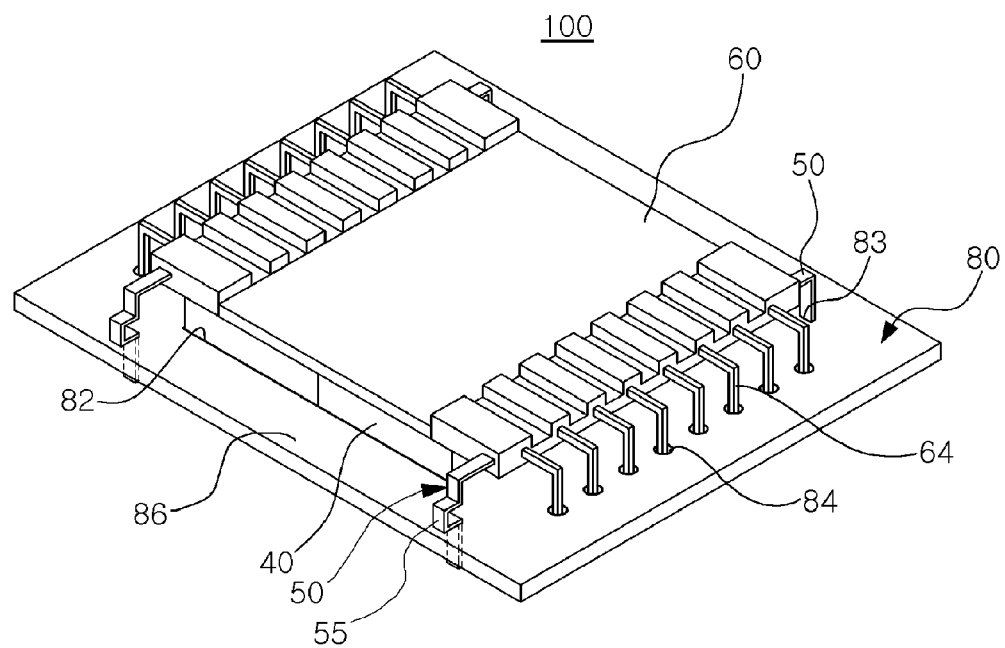
FIG. 7 is a schematic perspective view of a transformer assembly according to a third exemplary embodiment of the present invention.
Figure 8:
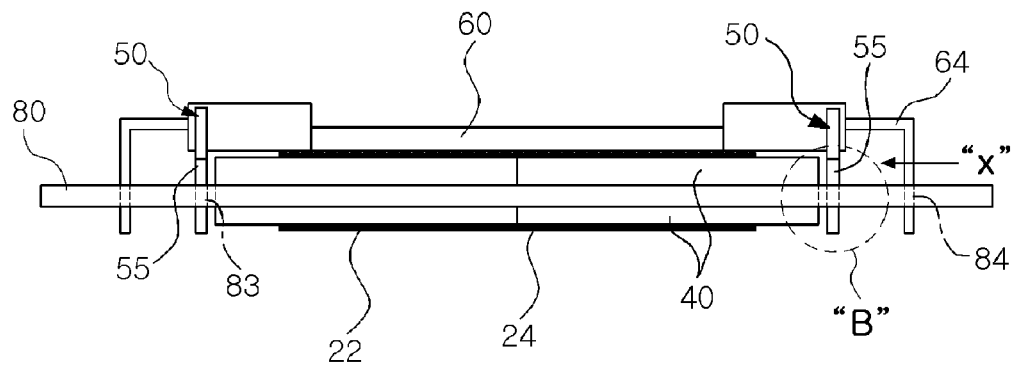
FIG. 8 is a side view of the transformer assembly according to the third exemplary embodiment of the present invention.
Figure 12:
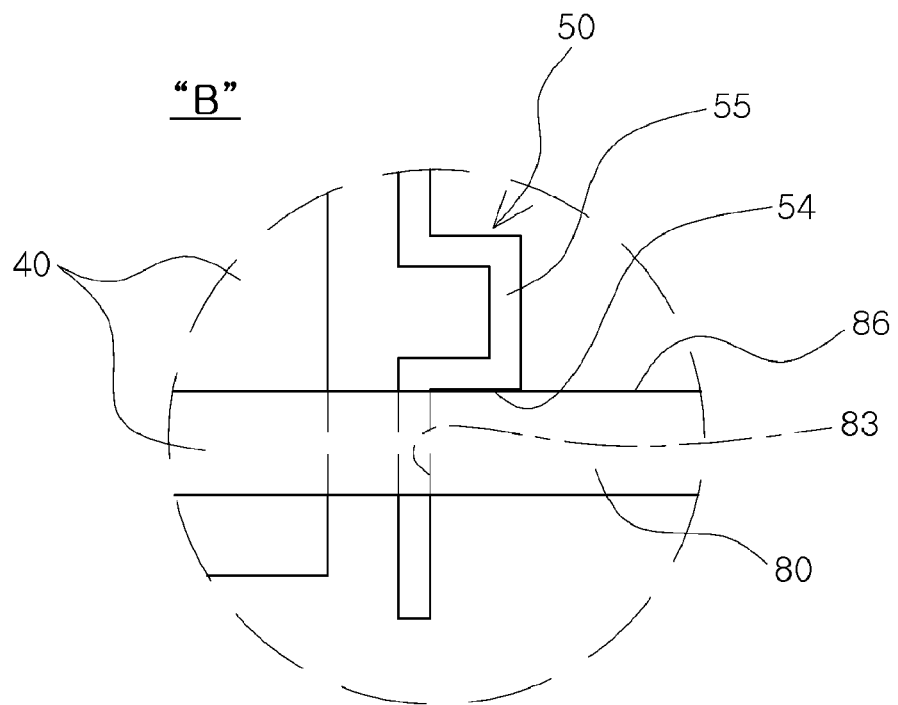
FIG. 12 is an enlarged sectional view of portion 'B' of FIG. 8 taken in the direction of the arrow therein.

FIG. 7 is a schematic perspective view of a transformer assembly according to a third exemplary embodiment of the present invention. FIG. 8 is a sectional view of the transformer assembly according to the third exemplary embodiment of the present invention. FIG. 12 is an enlarged sectional view of part 'B' in FIG. 8 taken in a direction of an arrow 'X'.

With reference to FIGS. 7, 8, and 12, in the transformer assembly 100 according to the third exemplary embodiment of the present invention, the base plate 60 may include a support pin 50, as a support member, supporting the space between the base plate 60 and the PCB 80.

The support pin 50 may be a structure separate from that of the lead frame 64 formed on the base plate 60. Also, the support pin 50 may have a stop portion 55 in contact with an upper surface 86 of the PCB 80. Also, a lower portion 54 of the stop portion 55 may be in contact with the upper surface 86 of the PCT 80.

In detail, the stop portion 55 may be implemented to have various shapes, such as a semicircular shape, as well as a channel-like shape as illustrated, so long as it is in contact with the upper surface 86 of the PCB 80.

The stop portion 55 is disposed on an upper space of the PCB 80, and more firmly supports the weight of the base plate 60 on which the lead frame 64 is formed.

Here, although not shown, if the support pin 50 is not provided, at least a portion of the lead frame 64 of the base plate 60 may have the stop portion 55 in contact with the upper surface 86 of the PCB 80.

Figure 9:
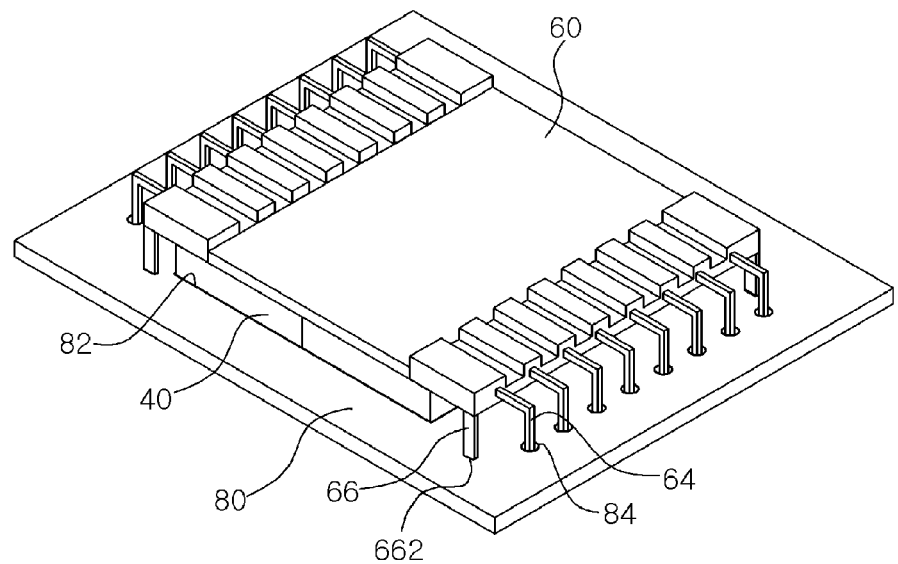
FIG. 9 is a schematic perspective view of a transformer assembly according to a fourth exemplary embodiment of the present invention.
Figure 10:
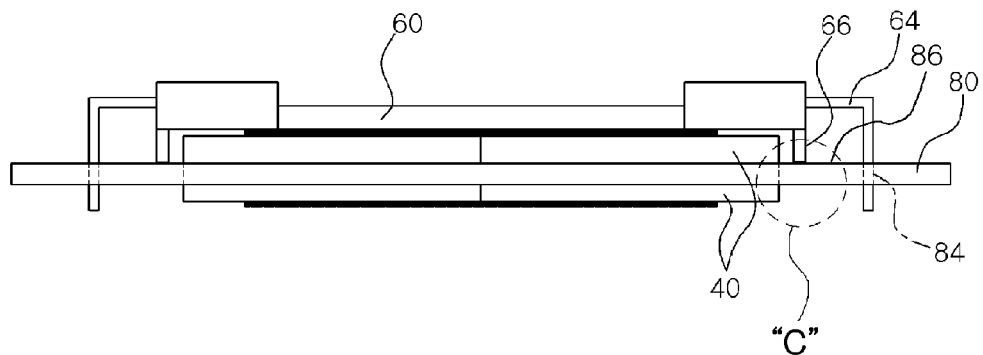
FIG. 10 is a side view of the transformer assembly according to the fourth exemplary embodiment of the present invention.
Figure 13:
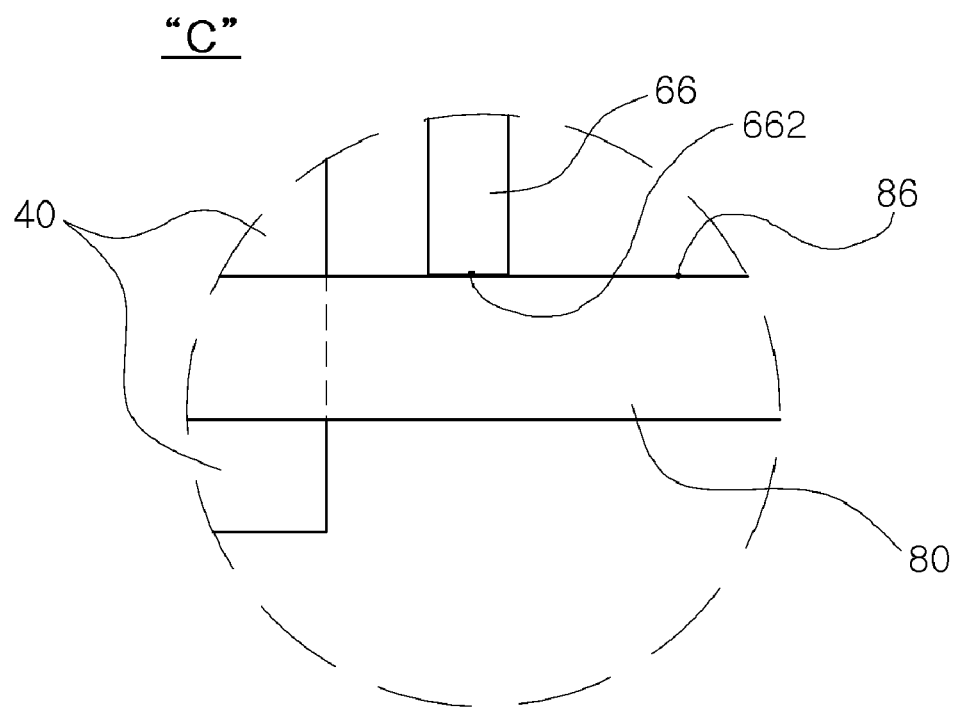
FIG. 13 is an enlarged sectional view of portion 'C' of FIG. 10.

FIG. 9 is a schematic perspective view of a transformer assembly according to a fourth exemplary embodiment of the present invention. FIG. 10 is a side view of the transformer assembly according to the fourth exemplary embodiment of the present invention. FIG. 13 is an enlarged sectional view of 'C' in FIG. 10.

With reference to FIGS. 9, 10, and 13, in the transformer assembly 100 according to the fourth exemplary embodiment of the present invention, the base plate 60 may include a boss 66, as a support member, supporting the space between the base plate 60 and the PCB 80.

The boss 66 may be an injection-molded product which is integrally injection-molded with the base plate 60 or separately injection-molded.

The boss 66 may be formed to extend from the base plate 60 at an outer edge of the core 40 toward the PCB 80. In this case, a lower end portion 662 of the boss 66 may extend to come into contact with the upper surface 86 of the PCB 80. The boss 66, in contact with the PCB 80, can stably support the weight of the base plate 60 on which the lead frame 64 is formed.

The lower end portion 662 of the boss 66 and the upper surface 86 of the PCB 80 may be fixedly attached with an adhesive.

The boss 66 can not only stably support the space between the base plate 60 and the PCB 80 but also complement the adhesion force of the lead frame 64 and the PCB 80.

Figure 14:
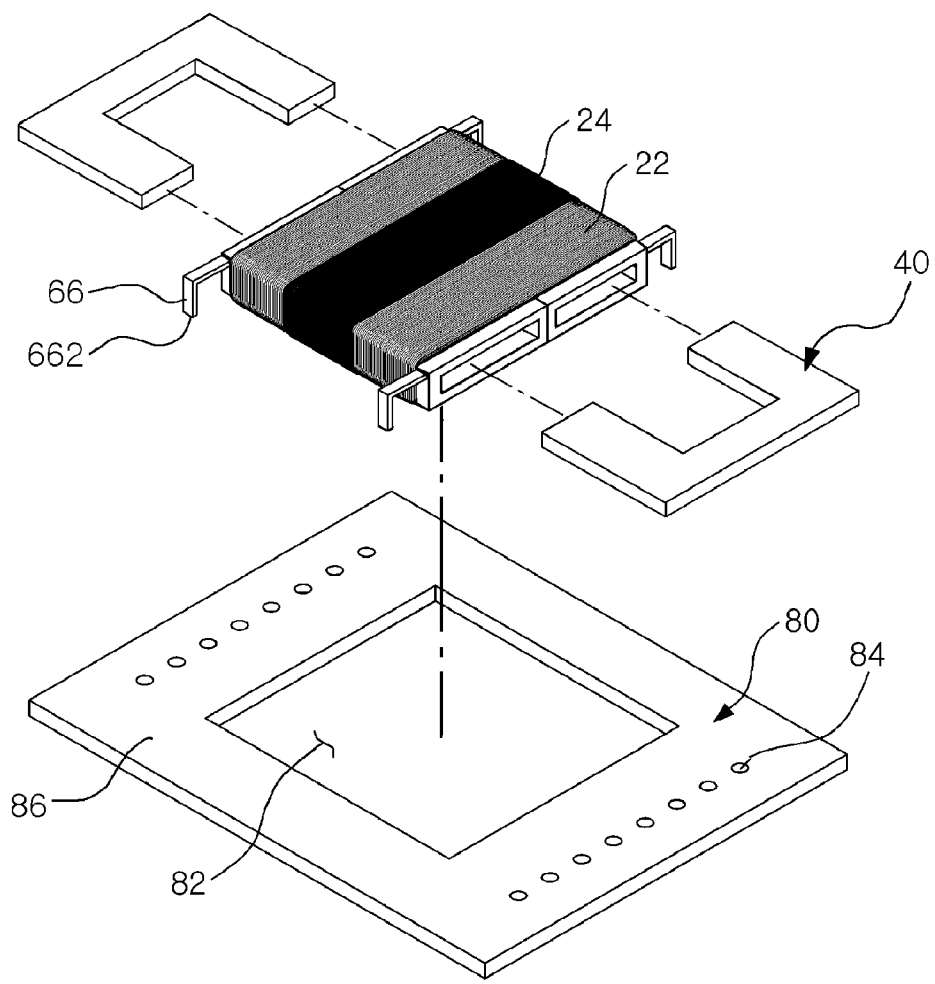
FIG. 14 is an exploded perspective view of a transformer assembly formed by coupling a transformer to a PCB according to another exemplary embodiment of the present invention.

FIG. 14 is an exploded perspective view of a transformer assembly formed by coupling a transformer to a PCB according to another exemplary embodiment of the present invention.

With reference to FIG. 14, in a transformer 10, a U-U type core 40 is coupled to two bobbins 20 with coils 22 wound therearound.

In the present exemplary embodiment, the transformer 10 may be mounted in a state of being insertedly positioned in the through hole 82 of the PCB 80. Also, since the bobbins 20 and the base plate 60 are installed on the PCB in a reversed manner, the bobbins 20 are disposed between the PCB 80 and the base plate 60, and the base plate 60 may have a space with the PCB 80 therebetween.

Here, the bobbin 20 of the transformer assembly 10 may include a boss 6, as a support member, supporting the space between the base plate 60 and the PCB 80.

The boss 66 may be integrally injection-molded with the bobbin 20, or may be separately injection-molded.

The boss 66 according to the present exemplary embodiment is different from the boss 66 in the exemplary embodiment of FIGS. 9, 10, and 13 in that it is coupled to the bobbin 20, rather than to the base plate 60, but is substantially the same, so that a description of the boss 66 will be replaced with the description of the exemplary embodiment of FIGS. 9, 10, and 13.

As set forth above, in the transformer and the transformer assembly according to exemplary embodiments of the invention, because the core is disposed within the core through hole formed on the PCB, the top face of the transformer can be lowered on the upper surface of the PCB.

In addition, since the height of the transformer is lowered on the upper surface of the PCB, the external appearance of a flat panel display can become thinner when compared with a flat panel display in which a transformer is installed at a normal position on the PCB.

Also, since the bobbin and the base plate are installed on the PCB in a reversed manner, the bobbin can be disposed in a space between the PCB and the base plate. Here, since the bobbin provides a structure supporting the space between the base plate and the PCB, the weight of the base plate on which the lead frame is formed can be stably supported on the PCB.

While the present invention has been shown and described in connection with the exemplary embodiments, it will be apparent to those skilled in the art that modifications and variations can be made without departing from the spirit and scope of the invention as defined by the appended claims.

What is claimed is:

1. A transformer comprising:
a bobbin on which a coil is wound;
a core coupled with the bobbin to provide a magnetic flux;
a printed circuit board (PCB) having a through hole, a portion of the core being disposed in the through hole;
a base plate electrically connected to the coil and having a lead frame connected to the PCB,
wherein the base plate is installed to be reversely disposed at an upper side of the bobbin on the PCB, a space is formed between a lower surface of the base plate and an upper surface of the PCB, and the space between the lower surface of the base plate and the upper surface of the PCB is supported by a support member in contact with the upper surface of the PCB.

2. The transformer of claim 1, wherein a lower surface of the base plate is separated from the upper surface of the PCB by a space equal to the distance by which the core is exposed from the upper surface of the PCB.

3. The transformer of claim 1, wherein the support member is an insulating member which is provided in the space between the PCB and the base plate and is fastened to an insulating member insertion hole formed on the PCB.

4. The transformer of claim 3, wherein the insulating member is an injection-molded product supporting the base plate and installed to be adjacent to the lead frame.

5. The transformer of claim 1, wherein the support member is formed on a portion of the lead frame, at least a portion of the support is formed as a stop portion in contact with the upper surface of the PCB, and at least a portion of the stop portion comprises a contact portion in contact with the upper surface of the PCB.

6. The transformer of claim 1, wherein the support member is formed separately to the lead frame and is a support pin supporting the space between the base plate and the PCB, the support pin comprises a support pin extending portion inserted into the PCB, and the support pin extending portion has a sectional area narrower than that of the support pin.

7. The transformer of claim 6, wherein the support pin extending portion is inserted into a support pin hole formed on the PCB to allow a lower surface of the support pin to be in contact with the upper surface of the PCB.

8. The transformer of claim 1, wherein the support member is formed separately to the lead frame and is a support pin supporting the space between the base plate and the PCB, a stop portion is formed at a portion of the support pin such that it is in contact with the upper surface of the PCB, and at least a portion of the stop portion is configured as a contact portion in contact with the upper surface of the PCB.

9. The transformer of claim 1, wherein the support member is a boss which supports the space between the base plate and the PCB and is an injection-molded product integrally formed with the base plate or formed separately thereto, a lower surface of the boss being in contact with the upper surface of the PCB.

10. The transformer of claim 1, wherein the support member is a boss which supports the space between the base plate and the PCB and is an injection-molded product integrally formed with the bobbin or separately formed, a lower surface of the boss being in contact with the upper surface of the PCB.

11. A transformer assembly comprising:
a transformer comprised of a core coupled to a bobbin with a coil wound therearound and a base plate supporting the core; and
a printed circuit board (PCB) having a through hole, a portion of the core being disposed in the through hole,
wherein the lead frame extends horizontally with the PCB from the base plate and is then bent to extend in a direction in which the core is mounted; and
wherein the transformer is installed on the PCB in a reversed form such that the base plate is disposed at an upper side of the bobbin on the PCB and a space is formed between a lower surface of the base plate and an upper surface of the PCB, the space being supported by a support member in contact with the upper surface of the PCB.

12. The assembly of claim 11, wherein the support member is an insulating member provided in a space between the base plate and the PCB, and an insulating member insertion hole is formed on the PCB allowing the insulating member to be inserted therein.

13. The assembly of claim 12, wherein the insulating member is an injection-molded product supporting the base plate and installed to be adjacent to the lead frame.

14. The assembly of claim 11, wherein the support member is formed on a portion of the lead frame, at least a portion of the support member is formed as a stop portion in contact with the upper surface of the PCB, and at least a portion of the stop portion comprises a contact portion in contact with the upper surface of the PCB.

15. The assembly of claim 11, wherein the support member is formed separately to the lead frame and is a support pin supporting the space between the base plate and the PCB, the support pin comprises a support pin extending portion inserted into the PCB, and the support pin extending portion has a sectional area narrower than that of the support pin.

16. The assembly of claim 15, wherein the support pin extending portion is inserted into a support pin hole formed on the PCB to allow a lower surface of the support pin to be in contact with the upper surface of the PCB.

17. The assembly of claim 11, wherein the support member is formed separately to the lead frame and is a support pin supporting the space between the base plate and the PCB, a stop portion is formed at a portion of the support pin such that it is in contact with the upper surface of the PCB, and at least a portion of the stop portion is configured as a contact portion in contact with the upper surface of the PCB.

18. The assembly of claim 11, wherein the support member is a boss which supports the space between the base plate and the PCB and is an injection-molded product integrally formed with the base plate or formed separately thereto, a lower surface of the boss being in contact with the upper surface of the PCB.

19. The assembly of claim 11, wherein the support member is a boss which supports the space between the base plate and the PCB and is an injection-molded product integrally formed with the bobbin or separately formed, a lower surface of the boss being in contact with the upper surface of the PCB.

* * * * *